United States Patent
Iliasevitch

(10) Patent No.: US 6,426,659 B1
(45) Date of Patent: Jul. 30, 2002

(54) APPARATUS FOR POWERING DOWN ELECTRONIC CIRCUITS

(75) Inventor: Stepan Iliasevitch, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/659,698

(22) Filed: Sep. 11, 2000

(51) Int. Cl.[7] .................................................. H03L 7/20
(52) U.S. Cl. ....................................... 327/143; 327/198
(58) Field of Search .............................. 327/142, 143, 327/198

(56) References Cited

U.S. PATENT DOCUMENTS

| | | | |
|---|---|---|---|
| 3,917,960 A | * 11/1975 | Kane | 327/198 |
| 4,386,286 A | 5/1983 | Kuo | |
| 4,639,661 A | 1/1987 | Williams et al. | |
| 4,912,429 A | 3/1990 | Takato et al. | |
| 5,013,938 A | 5/1991 | Estrada | |
| 5,543,741 A | * 8/1996 | Purits | 327/143 |
| 5,850,156 A | * 12/1998 | Wittman | 327/143 |

* cited by examiner

Primary Examiner—Timothy P. Callahan
Assistant Examiner—An T. Luu

(57) ABSTRACT

A bias block switching unit is responsive to a power down control signal for switching between first and second states thereof, being operatively coupled to a reference voltage and coupled to a first supply voltage. A first switch is responsive to the power down control signal for switching between first and second states thereof. The first switch provides an output signal. A first switched constant current unit is coupled to the first switch and a first supply voltage. A first switched constant current unit has a first state for providing a constant current output and a second state for providing substantially no current. The first switched constant current unit is responsive to a bias signal for switching between first and second states thereof. The bias signal is outputted from the bias block switching unit. A first voltage follower receives an input signal, is operatively coupled to a second voltage supply and operatively coupled to the first switch. An advantage is only permitting parasitic current during power-down operation.

20 Claims, 8 Drawing Sheets

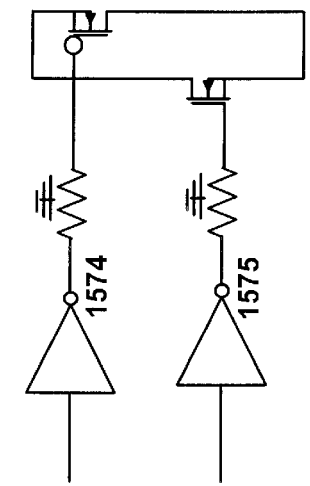
Figure 12C
Figure 12F
Figure 12I
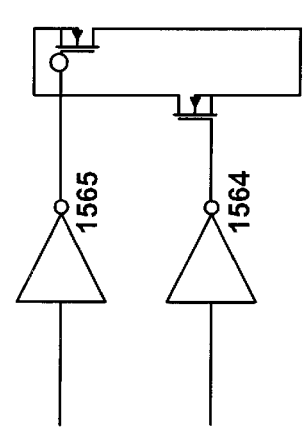
Figure 12B
Figure 12E
Figure 12H
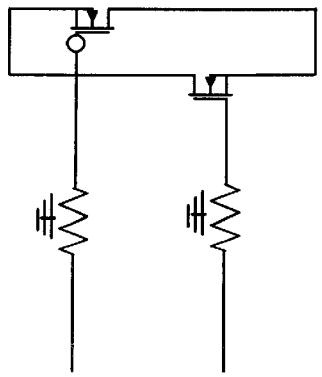
Figure 12A
Figure 12D
Figure 12G

APPARATUS FOR POWERING DOWN ELECTRONIC CIRCUITS

FIELD OF THE INVENTION

The present invention relates generally to electronic circuits and more particularly to a method and apparatus for circuit power-down.

BACKGROUND OF THE INVENTION

Power consumption is a key performance characteristic in electronic circuits. Low power consumption is desirable due to low heat dissipation and low power supply requirements.

A problem in electronic circuit design is that sometimes portions of an electronic circuit are not used for given period of time yet they still consume power during that time. Therefore, it is desirable to reduce the power consumption of unused portions of an electronic circuit for certain periods of time.

Techniques to reduce the power consumption of unused portions of an electronic circuit are known to exist. One such technique is a circuit arrangement for reducing a reference supply voltage level of a reference generator for an ECL circuit during a power-down mode. A first switching network is connected to the input of a reference generator for disabling the input of the reference generator in response to a control signal so as to reduce the level of the reference supply voltage. A second switching network is connected to the output of the reference generator for disabling the output of the reference generator in response to the control signal.

It is common to use transistors as switches to connect or disconnect two signal nodes so as to control the passage of ac and dc signals between the two nodes. Examples of such switches are bipolar, JFET or MOS switches.

When bipolar or JFET transistors are used, the control node of the transistors generally has low impedance to the signal nodes being switched so it must be allowed to follow the signal with minimum effect (i.e. with minimum ac current injection). This is to say it must have high a.c. impedance or it must have the a.c. signal specifically superimposed on any d.c. voltages needed for control. Such control techniques are known for bipolar and JFET switches.

When MOS transistors are used as switches, however, the situation is more complex because an alternate scheme is often used. With this scheme the controlling gate is connected to a sufficiently high potential to ensure the transistor will remain well turned on for the full range of signals to be switched, and the high impedance of the MOS gate prevents excessive loading of the signal. When very high frequency ac signals are involved, however, the capacitance between the channel and the gate of the MOS switch represent sufficiently low impedance to be a serious issue.

The known power-down techniques are deficient in that they affect the circuit performance during powered conditions and fail to reduce the power consumption of a circuit by an adequate amount.

Accordingly, there is a need to adequately power-down a circuit with minimal impact on circuit performance during powered conditions.

SUMMARY OF THE INVENTION

The present invention is directed to an apparatus for circuit power-down with minimal impact on circuit performance during powered conditions.

According to one aspect of the present invention, there is provided an apparatus for circuit power-down including a bias block switching means, a first switch, a first switched constant current means and a first voltage follower. The bias block switching means has a first node, second node and a third node. The bias block switching means has a first state for electrically connecting the first node and the third node and a second state for electrically connecting the second node and the third node. The bias block switching means is responsive to a power down control signal for switching between the first state of the bias block switching means the second state of the bias block switching means. The first node of the bias block switching means is operatively coupled to a reference voltage and the second node of the bias block switching means is operatively coupled to a first supply voltage. The first switch has a first node and a second node. The first switch has a first state for electrically isolating the first node and the second node and a second state for electrically connecting the first node and the second node. The first switch is responsive to the power down control signal for switching between the first state of the first switch and the second state of the first switch. The first node of the first switch provides the output signal. The first switched constant current means is coupled to the first node of the first switch and the first supply voltage. The first switched constant current means has a first state for providing a constant current output and a second state for providing substantially no current. The first switched constant current means is responsive to a bias signal for switching between the first state of the first switched constant current means and the second state of the first switched constant current means. The bias signal is output from the third node of the bias block switch. The first voltage follower has a first terminal, a second terminal and a third terminal. The first terminal receives the input signal, the second terminal is operatively coupled to the second voltage supply and the third terminal is operatively coupled to the second node of the first switch.

An advantage of the invention is that it only permits parasitic current during power-down operation.

Other aspect and features of the present invention will become apparent to those ordinarily skilled in the art upon review of the following description of specific embodiments of the invention in conjunction with the accompanying figures.

BRIEF DESCRIPTION OF THE DRAWINGS

The embodiments of the invention will now be described with reference to the accompanying drawings, in which:

FIG. 12 are alternate switch implementations according to the embodiments of the invention.

Similar references are used in different figures to denote similar components.

DETAILED DESCRIPTION OF THE INVENTION

In one embodiment of the invention, an emitter follower stage is biased by a current source, or resistor, a MOS transistor is connected between the third terminal of the emitter follower and the current source (or resistor). The gate of the MOS transistor is connected to a power-down control signal through a large resistor, or long channel inverter stage. This arrangement allows the third terminal of the emitter follower to be completely disconnected from the current source (or resistor) during power-down.

During normal operations, the MOS transistor will not slow down the input signal at high frequencies because its gate is connected to a power-down control signal through a large resistor, or high output impedance of the long channel inverter stage. Thus, the power down circuit uses switches to substantially shut off the current to the circuit to be powered-down, leaving the powered condition relatively unaffected, e.g. only parasitic currents are present, such as leakage.

Figure 1:
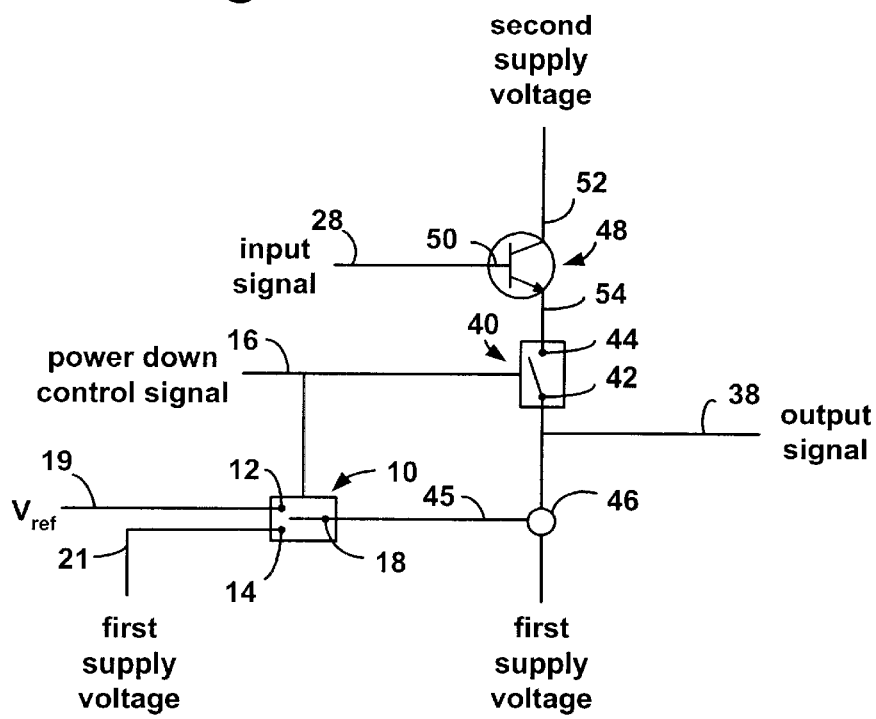
FIG. 1 is a block diagram of a power-down circuit.

FIG. 1 is a block diagram of a power-down circuit. The power down circuit includes a bias block switching means 10, a first switch 40, a first switched constant current source 46 and a first voltage follower 48. The bias block switching means 10 has a first node 12, second node 14 and a third node 18. The bias block switching means 10 has a first state for electrically connecting the first node 12 and the third node 18 and a second state for electrically connecting the second node 14 and the third node 18. The bias block switching means 10 is responsive to a power down control signal received on line 16 for switching between the first state of the bias block switching means 10 the second state of the bias block switching means 10. The first node 12 of the bias block switching means 10 is operatively coupled to a reference voltage, line 19, and the second node 12 of the bias block switching means 10 is opearatively coupled to a first supply voltage (Vcco), line 21. The first switch 40 has a first node 42 and a second node 44. The first switch 40 has a first state for electrically isolating the first node 42 and the second node 44 and a second state for electrically connecting the first node 42 and the second node 44. The first switch 40 is responsive to the power down control signal, line 16, for switching between the first state of the first switch 40 and the second state of the first switch 40. The first node 42 of the first switch 40 provides the output signal on line 38. The first switched constant current source 46 is coupled to the first node 42 of the first switch 40 and the first supply voltage on line 21. The first switched constant current source 46 has a first state for providing a constant current output and a second state for providing substantially no current. The first switched constant current source 46 is responsive to a bias signal, line 46, for switching between the first state of the first switched constant current source 46 and the second state of the first switched constant current source 46. The bias signal 45 is output from the third node 18 of the bias block switching means 10. The first voltage follower 48 has a first terminal 50, a second terminal 52 and a third terminal 54. The first terminal 50 receives the input signal, line 28, the second terminal 52 is operatively coupled to the second voltage supply, line 23, and the third terminal 54 is operatively coupled to the second node 44 of the first switch 40.

Figure 2:
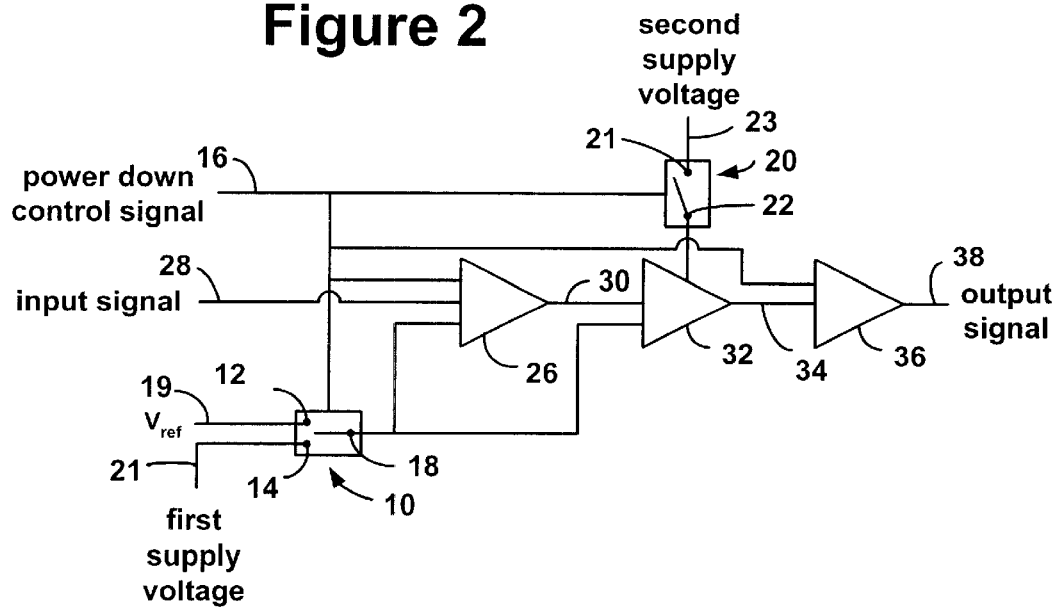
FIG. 2 is a block diagram of another power down circuit.

FIG. 2 is a block diagram of another power-down circuit. The power-down circuit includes a bias block switching means 10, a power supply switch 18, an input emitter follower 26, a buffer 32 and an output emitter followers 36. The bias block switching means 10 has a first node 12, a second node 14 and a third node 18. The bias block switching means 10 has a first state for electrically connecting the first node 12 and the third node 18 and a second state for electrically connecting the first node 12 and the second node 14. The bias block switching means 10 is responsive to a power down control signal, line 16, for switching between the first state of the bias block switching means 10 and the second state of the bias block switching means 10. The first node 12 of the bias block switching means 10 is operatively coupled to a reference voltage source, line 19. The second node 14 of the bias block switching means 10 is operatively coupled to a first voltage supply 21. The power supply switch 18 has a first node 20 and a second node 22. The power supply switch 18 has a first state for electrically isolating the first node 20 and second node 22 and a second state for electrically connecting the first node 20 and the second node 22. The power supply switch 18 is responsive to the power down control signal, line 16, for switching between the first state of the power supply switch 18 and the second state of the power supply switch 18. The first node 20 of the power supply switch 18 is operatively coupled to a second supply voltage, (Vcco) on line 23. The input emitter follower 26 receives an input signal on line 28, receives the power down control signal 16, and is operatively coupled to the third node 18 of the bias block switching means 10 for providing a buffer input signal 30. The buffer 32 is operatively coupled to the third node 18 of the bias block switching means 10 and to the second node 44 of the power supply switch 40. Buffer 32 receives the buffer input signal on line 30, and provides a buffer output signal on line 34. The output emitter follower 36 receives the buffer output signal, line 34, and the power down control signal on line 16 for providing an output signal on line 38, usually to a load.

Figure 3:
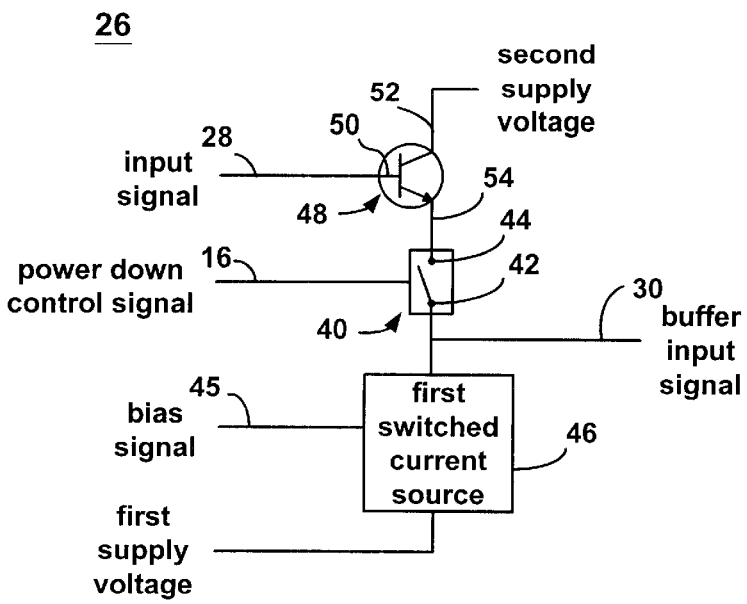
FIG. 3 is a block diagram of an input emitter follower.

FIG. 3 is a block diagram of the input emitter follower 26. The input emitter follower 26 includes a first switch 40, a first switched constant current source 46 and a first voltage follower 48. The first switch 40 has a first node 42 and a second node 44. The first switch 40 has a first state for electrically isolating the first node 42 and the second node 44, and a second state for electrically connecting the first node 42 and the second node 44. The first switch 40 is responsive to the power down control signal, line 16, for switching between the first state of the first switch 40 and the second state of first switch 40. The first node 42 of the first switch 40 provides the buffer input signal 30. The first switched constant current source 46 is coupled to the first node 42 of the first switch 40 and the first supply voltage 21, the first switched constant current source 46 having a first state for providing a constant current output and a second state for providing substantially no current, the first switched constant current means 46 being responsive to a bias signal, line 45, for switching between the first state of the first switched constant current means 46 and the second state of the first switched constant current means 46. The first voltage follower 48 has a first terminal 50, a second terminal 52 and a third terminal 54. The first terminal 50 receives the input signal 26, the second terminal 52 is operatively coupled to the second supply voltage 23 and the third terminal 54 is operatively coupled to the second node 44 of the first switch 40.

Figure 4:
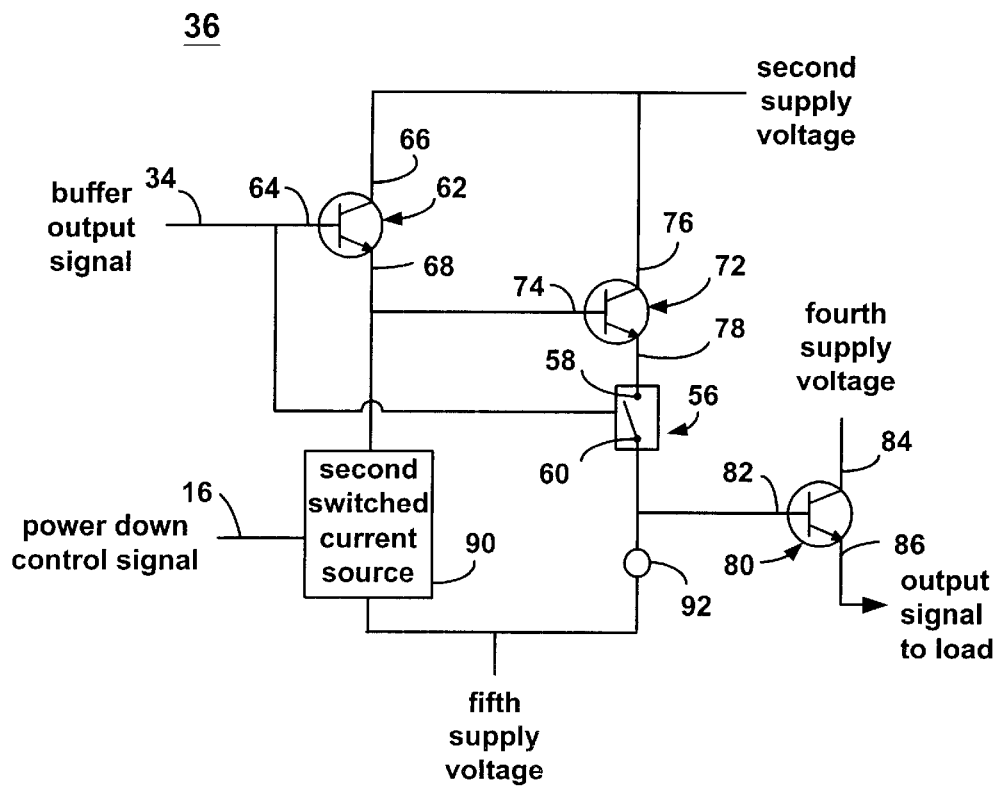
FIG. 4 is a block diagram of an output emitter follower.

FIG. 4 is a block diagram of the output emitter follower 36. The output emitter follower 36 includes a second switch 56, a second voltage follower 62, a third voltage follower 72, a fourth voltage follower 80, a second switched constant current source 90 and a third constant current source 92. The second switch 56 has a first node 58 and a second node 60. The second switch 56 has a first state for electrically isolating the first node 58 and the second node 60 and a second state for electrically connecting the first node 58 and the second node 60. The second switch 56 is responsive to the buffer output signal, line 34, for switching between the first state of the second switch 56 and the second state of the second switch 56. The second voltage follower 62 has a first terminal 64, a second terminal 66 and a third terminal 68. The first terminal 64 receives the buffer output signal, line 34. The second terminal 68 is operatively coupled to the second supply voltage, line 23. The third voltage follower 72 has a first terminal 74, a second terminal 76 and a third terminal 78. The first terminal 74 is operatively coupled to the third terminal 68 of the second voltage follower 62, the second terminal 76 is operatively coupled to the second supply voltage, line 23, and the third terminal 78 is operatively coupled to the first node 58 of the second switch 56. The fourth voltage follower 80 has a first terminal 82, a second terminal 84 and a third terminal 86. The first terminal 82 is operatively coupled to the second node 60 of the second switch 56, the second terminal 84 is operatively coupled to a fourth supply voltage 88 of the third terminal 86 provides the output signal, line 38. The second switched constant current source 90 is coupled to the third terminal 68 of the second voltage follower 62 and a fifth supply voltage, line 91. The second switched constant current source 90 has a first state for providing a constant current output and a second state for providing substantially no current. The second switched constant current source 90 is responsive to the power down control signal, line 16, for switching between the first state of the first switched constant current source 90 and the second state of the first switched constant current source 90. The third constant current source 92 is for providing a constant current output operatively coupled to the second node 60 of the second switch 58 and the fifth supply voltage 91.

Figure 5:
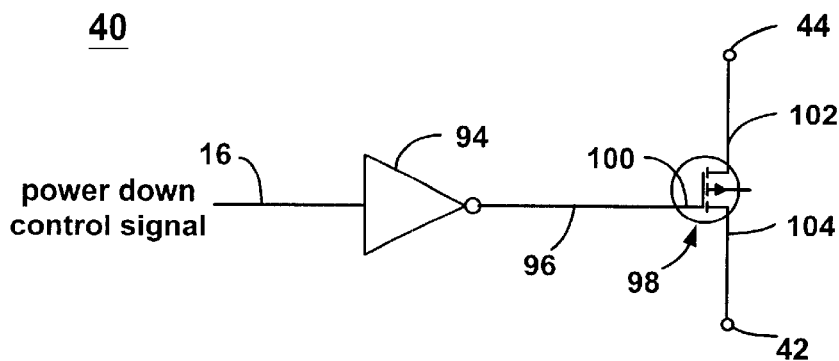
FIG. 5 is a block diagram of a first switch.

FIG. 5 is a block diagram of the first switch 40 of FIG. 2. The first switch 40 includes a first long channel inverter 94 and a first MOS transistor 98. The first long channel inverter 94 receives the power down control signal, line 16, and provides a first long channel inverter output signal on line 96. The first MOS transistor 98 has a gate 100, a source 104 and a drain 102. The gate 100 receives the first long channel inverter output signal, line 96, the drain 102 is coupled to the second node 44 of the first switch 40 and the source 104 is coupled to the first node 42 of the first switch 40.

Figure 6:
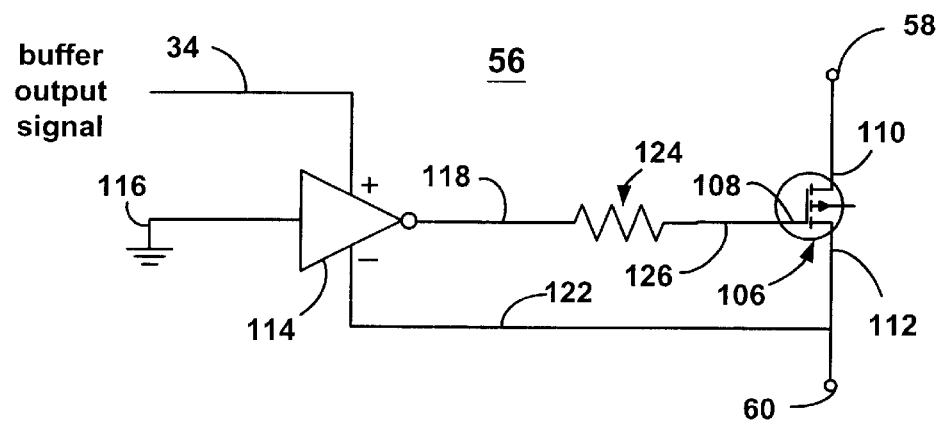
FIG. 6 is a block diagram of a second switch.

FIG. 6 is a block diagram of the second switch 56. The second switch 56 includes a fifth MOS transistor 106, a second long channel inverter 114 and a first large resistor 124. The fifth MOS transistor 106 has a gate 108, a source 112 and a drain 110. The drain 110 is the first node 58 of the second switch 56 and the source 112 is the second node 60 of the second switch 56. The second long channel inverter 114 is operatively coupled to ground, line 116, and provides a second long channel output signal on line 118. A positive supply input of the second long channel inverter 114 receives the buffer output signal on line 34. A negative supply input of the second long channel inverter 114 is operatively coupled to the source 112 of the fifth MOS transistor 106 on line 122. A first large resistor 124 receives the second long channel inverter output signal on line 118 and provides a first large resistor output signal on line 126 to the gate 108 of the fifth MOS transistor 106.

Figure 7:
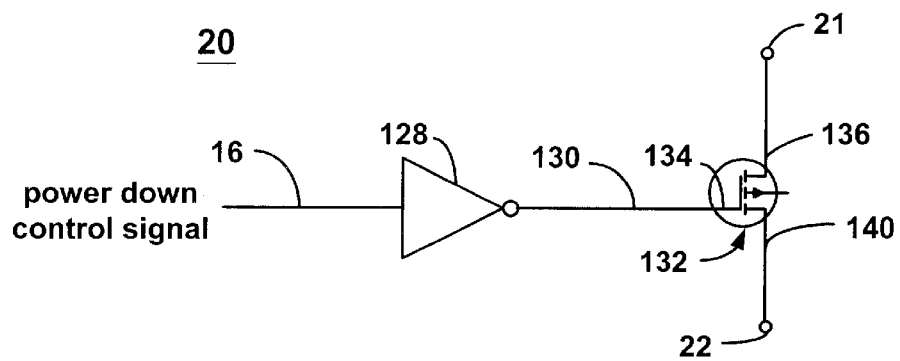
FIG. 7 is a block diagram of a power supply switch.

FIG. 7 is a block diagram of the power supply switch 18. The power supply switch 18 includes an inverter 128 and a ninth PMOS transistor 132. The inverter 128 receives the power down control signal 16 and is for providing an inverter output signal 130. The ninth PMOS transistor 132 has a gate 134, a source 136 and a drain 140. The gate 134 receives the inverter output signal 130, the drain 140 is coupled to the second node 22 of the power supply switch 18 and the source 136 is coupled to the first node 20 of the power supply switch 18.

Figure 8:
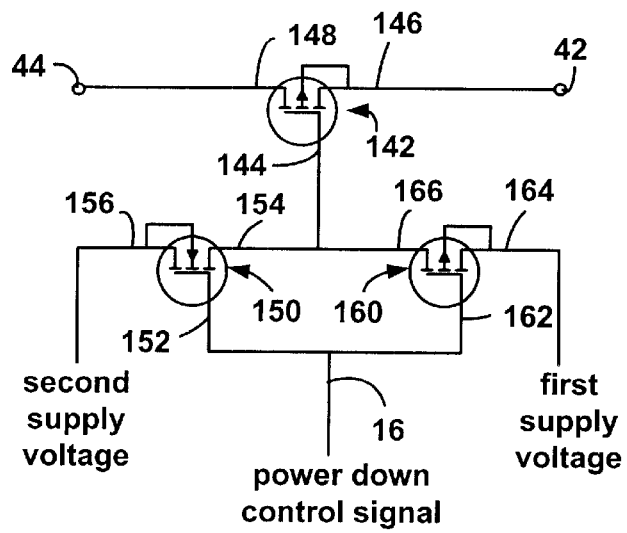
FIG. 8 is a more detailed block diagram of the first switch.

FIG. 8 is a more detailed block diagram of the first switch 40. In more detail, the first switch 40 includes a second MOS transistor 142, a third MOS transistor 150 and a fourth MOS transistor 160. The second MOS transistor 142 has a gate 144, a source 146 and a drain 148. The drain 148 is coupled to the second node 44 of the first switch 40, and the source 146 is coupled to the first node 42 of the first switch 40. The third MOS transistor 150 has a gate 156, a source 154 and a drain 154. The gate 152 receives the power down control signal, 16, the source 156 is operatively coupled to a second supply voltage, line 23, and the drain 14 is operatively coupled to the gate 144 of the second MOS transistor 142. The fourth MOS transistor 160 has a gate 162, a source 164 and a drain 166. The gate 162 receives the power down control signal, line 16, the drain 166 is operatively coupled to the gate 144 of the second MOS transistor 142 and the source 164 is operatively coupled to the first supply voltage 21.

Figure 9:
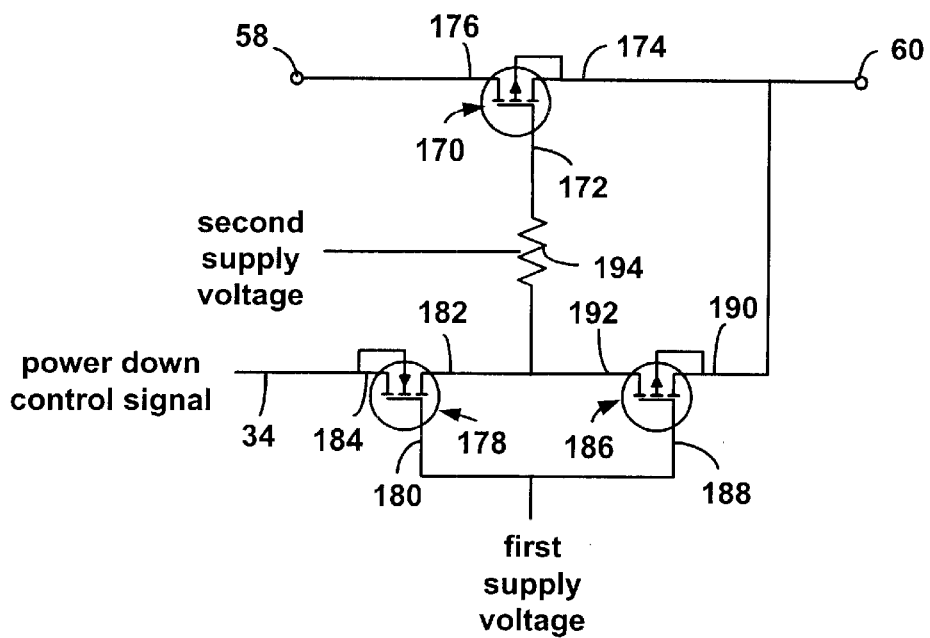
FIG. 9 is a more detailed block diagram of the second switch.

FIG. 9 is a more detailed block diagram of the second switch 56. In more detail, the second switch 56 includes a sixth MOS transistor 170, a seventh MOS transistor 178, an eight MOS transistor 186 and a second large resistor 194. The sixth MOS transistor 170 has a gate 172, a source 174 and a drain 176. The drain 176 is connected to the first node 58 of the second switch 56 and the source 174 is connected to the second node 60 of the second switch 56. The seventh MOS transistor 178 has a gate 180, a drain 182 and a source 184. The source 184 receives the power down control signal, line 34, the gate 180 is operatively coupled to the first supply voltage, line 21. The eighth MOS transistor 186 has a gate 188, a source 190 and a drain 192. The source 190 is operatively coupled to the source 174 of the sixth MOS transistor 170, the drain 192 is operatively coupled to the source 182 of the seventh MOS transistor 178 and the gate 188 is operatively coupled to the first supply voltage 21. The second large resistor 194 is operatively coupled between the gate 172 of the sixth MOS transistor 170 and the drain 182 of the seventh MOS transistor 178.

Figure 10:
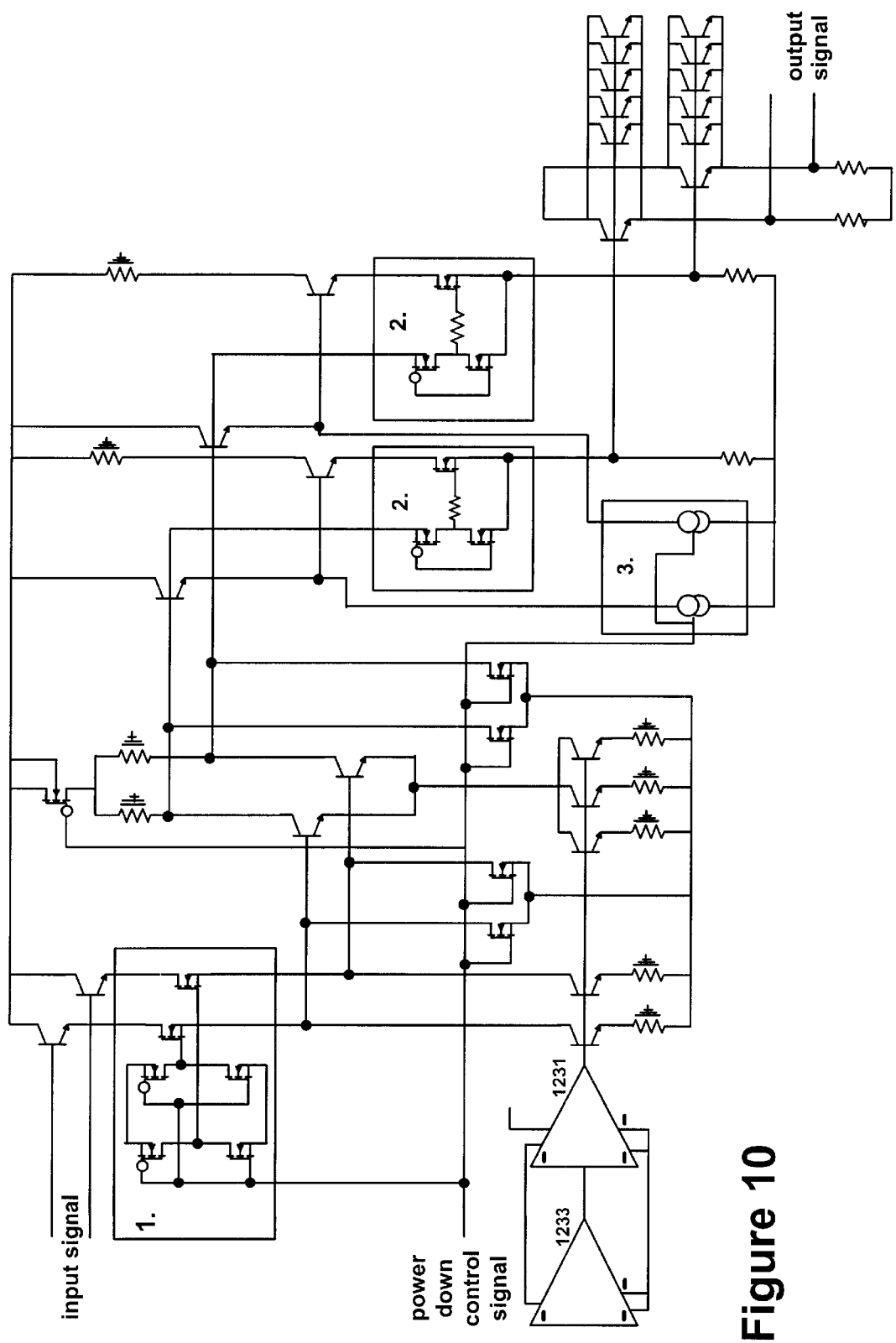
FIG. 10 is a more detailed block diagram of the power-down circuit.

FIG. 10 is a diagram of one implementation of the one embodiment of the power-down circuit, including blocks 1, 2, and 3.

Figure 11:
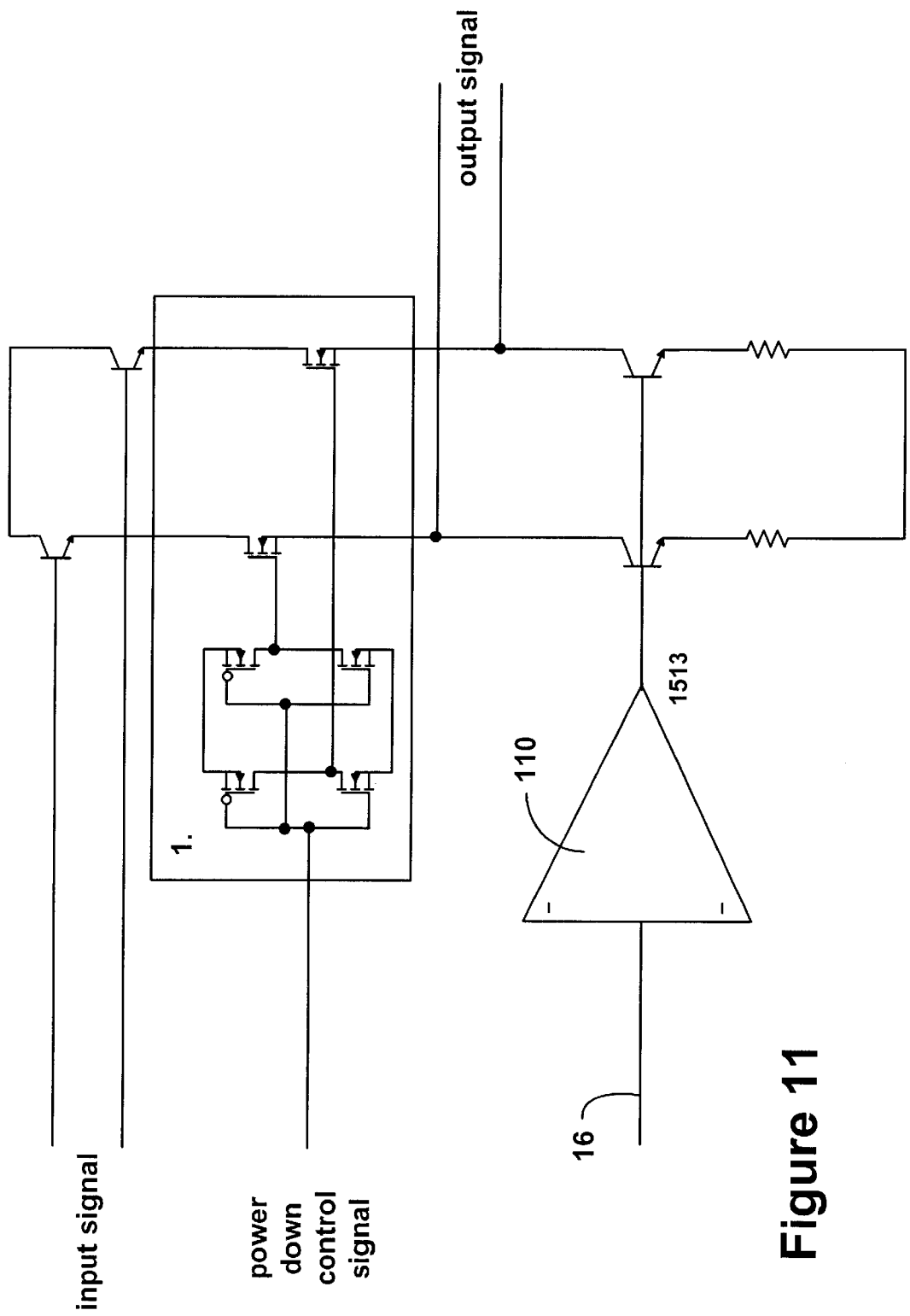
FIG. 11 is an embodiment of the invention including a powered down voltage reference in place of the bias block switching means.

FIG. 11 is an detailed diagram of block 1 of FIG. 10 including a powered down voltage reference in place of the bias block 110 and switching means 18. Block 1 of FIG. 10, along with more detailed implementations of the first switch 40, as illustrated in FIG. 11, and the first switched current source 46, is a preferred embodiment of the invention. The powered down voltage reference 110 receives the power down control signal on line 16 and provides the bias signal on line 30. Preferably, the power down control signal has two values, one corresponding to a powered condition and one corresponding to a power down condition. When the power down control signal has the powered value, then the powered down voltage reference 110 provides a bias signal substantially equal to the base-emitter voltage plus a constant voltage. When the power down control signal has the powered down value, then the powered down voltage reference element provides a bias signal substantially equal to zero.

FIG. 12 shows various switch 40 implementations according to embodiments of the invention.

Figure 13A:
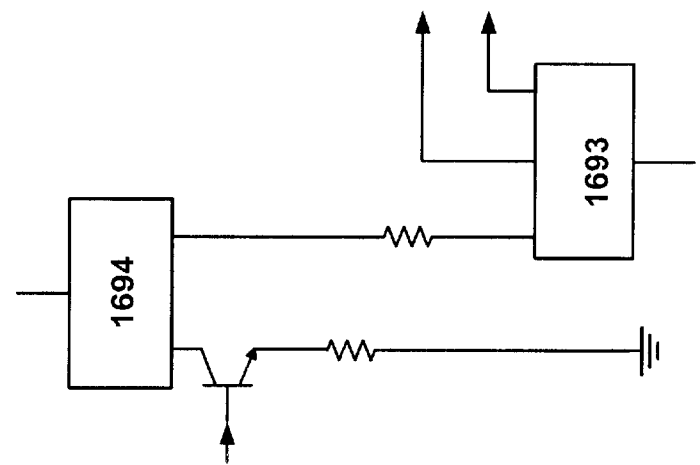
FIG. 13 are various alternate implementations of the first switched current source or the second switched current source, or both.
Figure 13B:
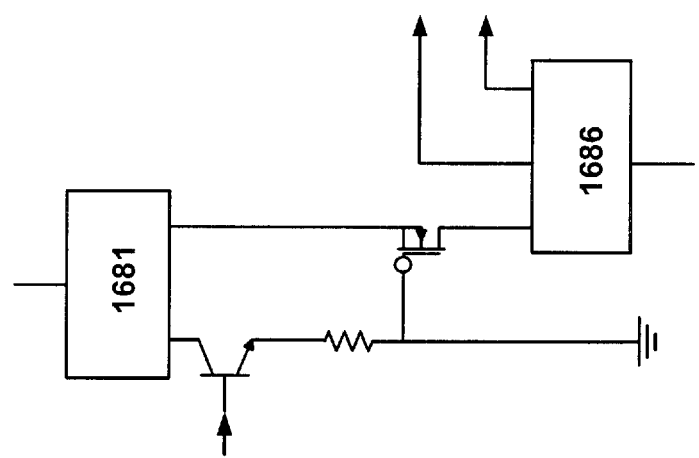
Figure 13C:
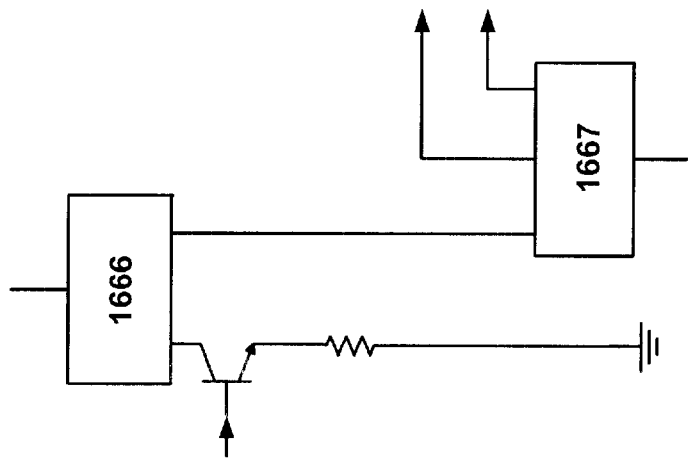

FIG. 13 shows various alterative implementations of the first switched current source 46 of FIG. 1, or the second switched current source block 3 of FIG. 10.

Using MOS devices as switches is advantageous as the minimize voltage drops with no effect on supply voltage, power, and headroom.

For very high frequency signals, the capacitance between the channel and the gate of the MOS switch represent a sufficiently low impedance to be a serious issue, in which case the high impedance control, or a control with the a.c. signal superimposed are solutions just as they are for bipolar and JFET devices.

The embodiments presented, have wide application with input/output amplifiers and pads, and may be used to completely power-down output pads, which may dissipate significant power on a chip.

Further, an embodiment of the invention uses MOS transistors as a.c. switches in high performance bipolar circuits. An example of this embodiment is a CML pad receives circuit that features complete power-down capability. This circuit can fully power down high performance circuits while minimizing impact of performance.

Another advantage of the invention is that a pre-drive inverter connecting the gate of the switch to another signal operating twice the first terminal-third terminal voltage above the signal being switched applies both a d.c. enable signal for the switch transistor and the superimposed a.c. signal, without need for additional complexity. In effect, both the PMOS device of the pre-drive inverter and the main NMOS switch both act as a.c. signal switches.

The invention offers the following advantages:(1) the power down control signal preferably has two values, one corresponding to a powered condition and one corresponding to a powered down condition; (2) The placement of the switches at the third terminal (output) of emitter followers minimizes the parasitic (leakage) current and shuts off the circuit in an optimally manner; (3) The power supply switch 18 disconnects the positive voltage supply from buffer 32. Otherwise, the second switch 56 is connected to Vcco, the gate connected to zero, and the top transistor 72 of FIG. 4 will be strongly on, and the second switch 56 will not disconnect; (4) The implementation of the first switch 40 using a long channel, and the second switch 56 using also a long channel, a resistor, and the connections to the positive and negative supply terminals reduces performance degradation during powered conditions while still adequately powering down. Also, there is a reduction in the ringing between the stages of the emitter followers 36. The parts used for implementing the invention as described, but still within the scope of the invention are as follows. Any type of transistor may be used, such as, but not limited to, BJT, differential pair, Darlington pair, FET, JFET, MOSFET, MESFET, PEMT and HBT. The transistors may be any configuration such as NPN or PNP with opposite voltages for one configuration as compared to another.

The elements may be differential and any number of output stages may be used. For a single stage, a pull down resistor may be needed to shut off current.

All current sources may be resistors. All second terminals cannot be below substrate voltage. If they are below the substrate voltage then the parasitic effects are larger.

While the present invention has been described in connection with what is presently considered to be the most practical and preferred embodiments, it is to be understood that the invention is not limited to the disclosed embodiments. To the contrary, the present invention is intended to cover various modifications, variations, adoptions and equivalent arrangements included within the spirit and scope of the appended claims. The scope of the claims is to be accorded the broadest interpretation so as to encompass all such modifications and equivalent structures and functions.

What is claimed is:

1. An apparatus for powering down electronic circuits comprising:

a bias block switching means having a first node, a second node and a third node, the bias block switching means having a first state for substantially electrically connecting the first node thereof and the third node thereof and a second state for substantially electrically connecting the second node thereof and the third node thereof, the bias block switching means being responsive to a power down control signal for switching between the first state of the bias block switching means and the second state of the bias block switching means, the first node of the bias block switching means being operatively coupled to a reference voltage and the second node of the bias block switching means being operatively coupled to a first supply voltage;

a first switch having a first node and a second node, the first switch having a first state for substantially electrically isolating the first node thereof and the second node thereof and a second state for substantially electrically connecting the first node thereof and the second node thereof, the first switch being responsive to the power down control signal for switching between the first state of the first switch and the second state of the first switch and the first node of the first switch providing an output signal;

a first switched constant current means coupled to the first node of the first switch and the first supply voltage, the first switched constant current means having a first state for providing a constant current output and a second state for providing substantially no current, the first switched constant current means being responsive to a bias signal for switching between the first state of the first switched constant current means and the second state of the first switched constant current means, the bias signal being outputted from the third node of the bias block switching means; and a first voltage follower having a first terminal, a second terminal and a third terminal, the first terminal receiving an input signal, the second terminal being operatively coupled to the second supply voltage and the third terminal being operatively coupled to the second node of the first switch.

2. The apparatus recited in claim 1 wherein the first switch comprises:

a first long channel inverter receiving the power down control signal for providing a first long channel inverter output signal; and a first MOS transistor having a a gate, a source and a drain, the gate receiving the first long channel inverter output signal, the drain being the first node of the first switch and the source being the second node of the first switch.

3. The apparatus recited in claim 1 wherein the first switch comprises:

a first MOS transistor having a gate, a source and a drain, the drain thereof being the first node of the first switch and the source thereof being the second node of the first switch;

a second MOS transistor having a gate, a source and a drain, the gate thereof receiving the power down control signal, the source thereof being operatively coupled to the second supply voltage and the drain thereof being operatively coupled to the gate of the first MOS transistor; and a third MOS transistor having a gate, a source and a drain, the gate thereof receiving the power down control signal, the drain thereof being operatively coupled to the gate of the first MOS transistor and the source thereof being operatively coupled to the first supply voltage, and the drains of the second and third MOS transistors are coupled to each other.

4. An apparatus for powering down electronic circuits comprising:

a bias block switching means having a first node, a second node and a third node, the bias block switching means having a first state for substantially electrically connecting the first node thereof and the third node thereof and the second state for substantially electrically connecting the second node thereof and the third node thereof, the bias block switching means being responsive to a power down control signal for switching between the first state of the bias block switching means and the second state of the bias block switching means, the first node of the bias block switching means being operatively coupled to a reference voltage and the second node of the bias block switching means being operatively coupled to a first supply voltage;

a power supply switch having a first node and a second node, the power supply switch having a first state for substantially electrically isolating the first node thereof and second node thereof and a second state for substantially electrically connecting the first node thereof and the second node thereof, the power supply switch being responsive to the power down control signal for switching between the first state of the power supply switch and the second state of the power supply switch, and the first node of the power supply switch being operatively coupled to a second supply voltage;

an input emitter follower receiving an input signal, receiving the power down control signal and operatively coupled to the third node of the bias block switching means for providing a buffer input signal;

a buffer receiving the buffer input signal, operatively coupled to the third node of the bias block switching means and operatively coupled to the second node of the power supply switch for providing a buffer output signal; and an output emitter follower receiving the buffer output signal and receiving the power down control signal for providing an output signal.

5. The apparatus recited in claim 4 wherein the input emitter follower comprises:

a first switch having a first node and a second node, the first switch having a first state for substantially electrically isolating the first node thereof and the second node thereof and a second state for substantially electrically connecting the first node thereof and the second node thereof, the first switch being responsive to the power down control signal for switching between the first state of the first switch and the second state of the first switch and the first node of the first switch providing the buffer input signal;

a first switched constant current means coupled to the first node of the first switch and the first supply voltage, the first switched constant current means having a first state for providing a constant current output and a second state for providing substantially no current, the first switched constant current means being responsive to a bias signal for switching between the first state of the first switched constant current means and the second state of the first switched constant current means, the bias signal being outputted from the third node of the bias block switching means; and a first voltage follower having a first terminal, a second terminal and a third terminal, the first terminal receiving the input signal, the second terminal being operatively coupled to the second supply voltage and the third terminal being operatively coupled to the second node of the first switch.

6. The apparatus recited in claim 5 wherein the first switch comprises:

a first long channel inverter receiving the power down control signal for providing a first long channel inverter output signal; and a first MOS transistor having a gate, a source and a drain, the gate receiving the first long channel inverter output signal, the drain being the first node of the first switch and the source being the second node of the first switch.

7. The apparatus recited in claim 5 wherein the first switch comprises:

a first MOS transistor having a gate, a source and a drain, the drain thereof being the first node of the first switch and the source thereof being the second node of the first switch;

a second MOS transistor having a gate, a source and a drain, the gate thereof receiving the power down control signal, the source thereof being operatively coupled to the second supply voltage and the drain thereof being operatively coupled to the gate of the first MOS transistor; and a third MOS transistor having a gate, a source and a drain, the gate thereof receiving the power down control signal, the drain thereof being operatively coupled to the gate of the fist MOS transistor and the source thereof being operatively coupled to the first supply voltage, and the drains of the second and third MOS transistors being coupled to each other.

8. The apparatus recited in claim 4 wherein the output emitter follower comprises:

a second switch having a first node and a second node, the second switch having a first state for substantially electrically isolating the first node thereof and the second node thereof and a second state for substantially electrically connecting the first node thereof and the second node thereof, the second switch being responsive to the buffer output signal for switching between the first state of the second switch and the second state of the second switch;

a first voltage follower having a first terminal, a second terminal and a third terminal, the first terminal receiving the buffer output signal and the second terminal being operatively coupled to the second supply voltage;

a second voltage follower having a first terminal, a second terminal and a third terminal, the first terminal thereof being operatively coupled to the third terminal of the second voltage follower, the second terminal thereof being operatively coupled to the second supply voltage and the third terminal thereof being opearatively coupled to the first node of the second switch;

a third voltage follower having a first terminal, a second terminal and a third terminal, the first terminal thereof being operatively coupled to the second node of the second switch, the second terminal thereof being operatively coupled to a fourth supply voltage and the third terminal thereof for providing the output signal;

a first switched constant current means coupled to the third terminal of the first voltage follower and a fifth supply voltage, the first switched constant current means having a first state for providing a constant current output and a second state for providing substantially no current, the first switched constant current means being responsive to the power down control signal for switching between the first state of the first switched constant current means and the second state of the first switched constant current means; and a second switched constant current means for providing a constant current output and operatively coupled to the second node of the second switch.

9. The apparatus recited in claim 8 wherein the second switch comprises:

a first MOS transistor having a gate, a source and a drain, the drain being the first node of the second switch and the source being the second node of the second switch;

a first long channel inverter operatively coupled to ground for providing a first long channel output signal, wherein a positive supply input of the second long channel inverter receives the buffer output signal and wherein a negative supply input of the first long channel inverter is operatively coupled to the source of the first MOS transistor; and a first large resistor receiving the first long channel inverter output signal for providing a first large resistor output signal to the gate of the first MOS transistor.

10. The apparatus recited in claim 8 wherein the second switch comprises:

a first MOS transistor having a gate, a source and a drain, the drain thereof being the first node of the second switch and the source thereof being the second node of the second switch;

a second MOS transistor having a gate, a source and a drain, the drain thereof receiving the power down control signal, the gate thereof being operatively coupled to the first supply voltage;

a third MOS transistor having a gate, a source and a drain, the source thereof being operatively coupled to the source of the first MOS transistor, the drain thereof being operatively coupled to the source of the second MOS transistor and the gate thereof being operatively coupled to the first supply voltage, and the source of the second MOS being coupled to the drain of the third MOS transistor; and a first large resistor operatively coupled between the gate of the first MOS transistor and the source of the second MOS transistor.

11. The apparatus recited in claim 4 wherein the power supply switch comprises:

an inverter receiving the power down control signal for providing an inverter output signal; and a first MOS transistor having a gate, a source and a drain, the gate receiving the inverter output signal, the drain being the first node of the power supply switch and the source being the second node of the power supply switch.

12. An apparatus for powering down electronic circuits comprising:

a bias block switching means having a first node, second node and a third node, the bias block switching means having a first state for substantially electrically connecting the first node and the third node and a second state for substantially electrically connecting the second node and the third node, the bias block switching means being responsive to a power down control signal for switching between the first state of the bias block switching means and the second state of the bias block switching means, the first node of the bias block switching means being operatively coupled to a reference voltage and the second node of the bias block switching means being operatively coupled to a first supply voltage.

a power supply switch having a first node and a second node, the power supply switch having a first state for substantially electrically isolating the first node thereof and the second node thereof and a second state for substantially electrically connecting the first node thereof and the second node thereof, the power supply switch being responsive to the power down control signal for switching between the first state of the power supply switch and the second state of the power supply switch, and the first node thereof being operatively coupled to a second supply voltage;

an input emitter follower receiving an input signal, receiving the power down control signal and coupled to the third node of the bias block switching means for providing a buffer input signal, wherein the input emitter follower comprises:

a first switch having a first node and a second node, the first switch having a first state for substantially electrically isolating the first node thereof and the second node thereof and a second state for substantially electrically connecting the first node thereof and the second node thereof, the first switch being responsive to the power down control signal for switching between the first state of the first switch and the second state of the first switch;

a first switched constant current means coupled to the first node of the first switch and the first supply voltage, first switched constant current means having a first state for providing a constant current output and a second state for providing substantially no current, the first switched constant current means being responsive to a bias signal for switching between the first state of the first switched constant current means and the second state of the first switched constant current means, the bias signal being outputted from the third node of the bias blocks witching means; and a first voltage follower having a first terminal, a second terminal and a third terminal, the first terminal receiving the input signal, the second terminal being operatively coupled to the second voltage supply and the third terminal being operatively coupled to the second node of the first switch and for providing the buffer input signal.

a buffer receiving the buffer input signal, coupled to the third node of the bias block switching means and coupled to the second node of the power supply switch for providing a buffer output signal; and an output emitter follower receiving the buffer output signal and receiving the power down control signal for providing an output signal, wherein the output emitter follower comprises:

a second switch having a first node and a second node, the second switch having a first state for substantially electrically isolating the first node thereof and the second node thereof and a second state for substantially electrically connecting the first node thereof and the second node thereof, the second switch being responsive to the buffer output signal for switching between the first state of the second switch and the second state of the second switch;

a second voltage follower having a first terminal, a second terminal and third terminal, the first terminal thereof receiving the buffer output signal and the second terminal thereof being operatively coupled to a third supply voltage;

a third voltage follower having a first terminal, a second terminal and a third terminal, the first terminal thereof being operatively coupled to the third terminal of the second voltage follower, the second terminal thereof being operatively coupled to the third supply voltage and the third terminal being operatively coupled to the first node of the second switch;

a fourth voltage follower having a first terminal, a second terminal and a third terminal, the first terminal thereof being operatively coupled to the second node of the second switch, the second terminal thereof being operatively coupled to a fourth supply voltage and the third terminal thereof for providing the output signal;

a second switched constant current means coupled to the third terminal of the second voltage follower and a fifth supply voltage, the second switched constant current means having a first state for providing a constant current output and a second state for providing substantially no current, the second switched constant current means being responsive to the power down control signal for switching between the first state of the first switched constant current means and the second state of the first switched constant current means; and a third switched constant current means for providing a constant current output operatively coupled to the second node of the second switch.

13. The apparatus as recited in claim 12 wherein the first switch comprises:

a first long channel inverter receiving the power down control signal for providing a first long channel inverter output signal; and a first MOS transistor having a gate, a source and a drain, the gate thereof receiving the first long channel inverter output signal, the drain thereof being the first node of the first switch and the source thereof being the second node of the first switch; and wherein the second switch comprises:

a first MOS transistor having a gate, a source and a drain, the drain thereof being the first node of the second switch and the source thereof being the second node of the second switch a second long channel inverter operatively coupled to ground for providing a second long channel output signal, wherein a positive supply input of the second long channel inverter receives the buffer output signal and wherein a negative supply input of the second long channel inverter is operatively coupled to the source of the first MOS transistor; and a first large resistor receiving the second long channel inverter output signal for providing a first large resistor output signal to the gate of the first MOS transistor.

14. The apparatus as recited in claim 13 wherein the power supply switch comprises:

an inverter receiving the power down control signal for providing an inverter output signal; and a fist MOS transistor having a gate, a source and a drain, the gate thereof receiving the inverter output signal, the drain thereof being the first node of the power supply switch and the source thereof being the second node of the power supply switch.

15. The apparatus as recited in claim 12 wherein the first switch comprises:

a first MOS transistor having a gate, a source and a drain, the drain thereof being the first node of the first switch and the source thereof being the second node of the first switch;

a second MOS transistor having a gate, a source and a drain, the gate thereof receiving the power down control signal, the drain thereof being operatively coupled to the second supply voltage and the source thereof being operatively coupled to the gate of the first MOS transistor; and a third MOS transistor having a gate, a source and a drain, the gate thereof receiving the power down control signal, the drain thereof being operatively coupled to the gate of the first MOS transistor and the source thereof being operatively coupled to the first supply voltage; and wherein the second switch comprises:

a first MOS transistor having a gate, a source and a drain, the drain thereof being the first node of the second switch and the source thereof being the second node of the second switch;

a second MOS transistor having a gate, a source and a drain, the drain thereof receiving the power down control signal, the gate thereof being operatively coupled to the second supply voltage;

a third MOS transistor having a gate, a source and a drain, the source thereof being operatively coupled to the source of the first MOS transistor, the drain thereof being operatively coupled to the source of the second MOS transistor and the gate thereof being operatively coupled to the first supply voltage; and a second large resistor operatively coupled between the gate of the first MOS transistor and the source of the second MOS transistor.

16. The apparatus as recited in claim 15 wherein the power supply switch comprises:

an inverter receiving the power down control signal for providing an inverter output signal; and a first MOS transistor having a gate, a source and a drain, the gate thereof receiving the inverter output signal, the drain thereof being the first node of the power supply switch and the source thereof being the second node of the power supply switch.

17. An apparatus for powering down electronic circuits comprising:

a bias block switching means having a first node, a second node and a third node, the bias block switching means having a first state for substantially electrically connecting the first node and the third node and a second state for substantially electrically connecting the second node and the third node, the bias block switching means being responsive to a power down control signal for switching between the first state of the bias block switching means and the second state of the bias block switching means, the first node of the bias block switching means being operatively coupled to a reference voltage and the second node of the bias block switching means being operatively coupled to a first supply voltage;

a power supply switch having a first node and a second node, the power supply switch having a first state for substantially electrically isolating the first node thereof and second node thereof and a second state for substantially electrically connecting the fist node thereof and the second node thereof, the power supply switch being responsive to the power down control signal for switching between the first state of the power supply switch and the second state of the power supply switch, and the first node thereof being operatively coupled to a second supply voltage, wherein the power supply switch comprises:

an inverter receiving the power down control signal for providing an inverter output signal; and a first MOS transistor having a gate, a source and a drain, the gate thereof receiving the inverter output signal, the drain thereof being the first node of the power supply switch and the source thereof being the second node of the power supply switch;

an input emitter follower receiving an input signal, receiving the power down control signal and coupled to the third node of the bias block switching means for providing a buffer input signal, wherein the input emitter follower comprises:

a first switch having a first node and a second node, the first switch having a first state for substantially electrically isolating the first node thereof and the second node thereof and a second state for substantially electrically connecting the first node thereof and the second node thereof, the first switch being responsive to the power down control signal for switching between the first state of the first switch and the second state of the first switch, wherein the first switch comprises:

a first MOS transistor having a gate, a source and a drain, the drain thereof being the first node of the first switch and the source thereof being the second node of the first switch;

a second MOS transistor having a gate, a source and a drain, the gate thereof receiving the power down control signal, the drain thereof being operatively coupled to the second supply voltage and the source thereof being operatively coupled to the gate of the first MOS transistor; and a third MOS transistor having a gate, a source and a drain, the gate thereof receiving the power down control signal, the drain thereof being operatively coupled to the gate of the first MOS transistor and the source being operatively coupled to the first supply voltage;

a first switched constant current means coupled to the first node of the first switch and the first supply voltage, first switched constant current means having a first state for providing a constant current output and a second state for providing substantially no current, the first switched constant current means being responsive to a bias signal for switching between the first state of the first switched constant current means and the second state of the first switched constant current means, the bias signal being outputted from the third node of the bias block switch; and a first voltage follower having a first terminal, a second terminal and third terminal, the first terminal thereof receiving the input signal, the second terminal thereof being operatively coupled to the second voltage supply and the third terminal thereof being operatively coupled to the second node of the first switch and for providing the buffer input signal;

a buffer receiving the buffer input signal, coupled to the second node of the bias block switching means and coupled to the second node of the power supply switch for providing a buffer output signal; and an output emitter follower receiving the buffer output signal and receiving the power down control signal for providing an output signal, wherein the output emitter follower comprises:

a second switch having a first node and a second node, the second switch having a first state for substantially electrically isolating the first node thereof and the second node thereof and a second state for substantially electrically connecting the first node thereof and the second node thereof, the second switch being responsive to the buffer output signal for switching between the first state of the second switch and the second state of the second switch, wherein the second switch comprises:

a first MOS transistor having a gate, a source and a drain, the drain thereof being the first node of the second switch and the source thereof being the second node of the second switch;

a second MOS transistor having a gate, a source and a drain, the drain thereof receiving the power down control signal, the gate thereof being operatively coupled to the second supply voltage;

a third MOS transistor having a gate, a source and a drain, the source thereof being operatively coupled to the source of the first MOS transistor, the drain thereof being operatively coupled to the source of the second MOS transistor and the gate thereof being operatively coupled to the first supply voltage; and a first large resistor operatively coupled between the gate of the first MOS transistor and the source of the second MOS transistor;

a second voltage follower having a first terminal, a second terminal and third terminal, the first terminal thereof receiving the buffer output signal and the second terminal thereof being operatively coupled to a third supply voltage;

a third voltage follower having a first terminal, a second terminal and a third terminal, the first terminal thereof being operatively coupled to the third terminal of the second voltage follower, the second terminal thereof being operatively coupled to the third supply voltage and the third terminal thereof being operatively coupled to the first node of the second switch;

a fourth voltage follower having a first terminal, a second terminal and a third terminal, the first terminal thereof being operatively coupled to the second node of the second switch, the second terminal thereof being operatively coupled to a fourth supply voltage and the third terminal thereof for providing the output signal;

a second switched constant current means coupled to the third terminal of the second voltage follower and a fifth supply voltage, second switched constant current means having a first state for providing a constant current output and a second state for providing substantially no current, the second switched constant current means being responsive to the power down control signal for switching between the first state of the first switched constant current means and the second state of the first switched constant current means; and a third switched constant current means for providing a constant current output operatively coupled to the second node of the second switch.

18. An apparatus for powering down electronic circuits comprising:

a powered down voltage reference means for providing a bias signal, the powered down voltage reference means having a first state for producing the bias signal substantially equal to a base-emitter voltage plus a constant voltage and a second state for producing the bias signal substantially equal to zero, the powered down voltage reference means being responsive to a power down control signal for switching between the first state of the powered down voltage reference means the second state of the powered down voltage reference means;

a first switch having a first node and a second node, the first switch having a first state for substantially electrically isolating the first node thereof and the second node thereof and a second state for substantially electrically connecting the first node thereof and the second node thereof, the first switch being responsive to the power down control signal for switching between the first state of the first switch and the second state of the first switch and the first node of the first switch providing the output signal;

a first switched constant current means coupled to the first node of the first switch and a first supply voltage, the first switched constant current means having a first state for providing a constant current output and a second state for providing substantially no current, the first switched constant current means being responsive to a bias signal for switching between the first state of the first switched constant current means and the second state of the first switched constant current means, the bias signal being outputted from the third node of the bias block switch; and a first voltage follower having a first terminal, a second terminal and third terminal, the first terminal thereof receiving the input signal, the second terminal thereof being operatively coupled to a second voltage supply and the third terminal thereof being operatively coupled to the second node of the first switch.

19. The apparatus recited in claim 18 wherein the first switch comprises:

a first long channel inverter receiving the power down control signal for providing a first long channel inverter output signal; and a first MOS transistor having a gate, a source and a drain, the gate thereof receiving the first long channel inverter output signal, the drain thereof being the first node of the first switch and the source thereof being the second node of the first switch.

20. The apparatus recited in claim 18 wherein the first switch comprises:

a first MOS transistor having a gate, a source and a drain, the drain thereof being the first node of the first switch and the source thereof being the second node of the first switch;

a second MOS transistor having a gate, a source and a drain, the gate thereof receiving the power down control signal, the drain thereof being operatively coupled to the second supply voltage and the source thereof being operatively coupled to the gate of the second MOS transistor; and a third MOS transistor having a gate, a source and a drain, the gate thereof receiving the power down control signal, the drain thereof being operatively coupled to the gate of the second MOS transistor and the source thereof being operatively coupled to the first supply voltage.

* * * * *